(12) United States Patent
Brar et al.

(10) Patent No.: US 7,808,016 B2
(45) Date of Patent: Oct. 5, 2010

(54) HETEROGENEOUS INTEGRATION OF LOW NOISE AMPLIFIERS WITH POWER AMPLIFIERS OR SWITCHES

(75) Inventors: Berinder Brar, Newbury Park, CA (US); Joshua I. Bergman, Thousand Oaks, CA (US); Amal Ikhlassi, Thousand Oaks, CA (US); Gabor Nagy, Thousand Oaks, CA (US); Gerard J. Sullivan, Newbury Park, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 959 days.

(21) Appl. No.: 11/521,011

(22) Filed: Sep. 14, 2006

(65) Prior Publication Data

US 2008/0067559 A1    Mar. 20, 2008

(51) Int. Cl.
*H01L 31/109* (2006.01)
(52) U.S. Cl. .................. 257/194; 257/192; 257/195; 257/E29.246
(58) Field of Classification Search ........... 257/194
See application file for complete search history.

(56) References Cited

U.S. PATENT DOCUMENTS

| | | | |
|---|---|---|---|
| 5,412,224 A | 5/1995 | Goronkin et al. | |
| 5,430,310 A | 7/1995 | Shibasaki et al. | |
| 5,739,559 A * | 4/1998 | Kagaya et al. | 257/192 |
| 6,153,897 A * | 11/2000 | Oguri et al. | 257/194 |
| 6,215,136 B1 * | 4/2001 | Tserng et al. | 257/192 |
| 2002/0131462 A1 | 9/2002 | Lin et al. | |
| 2003/0015767 A1 | 1/2003 | Emrick et al. | |
| 2006/0035467 A1 | 2/2006 | Nam et al. | |
| 2006/0215718 A1 | 9/2006 | Yasuda et al. | |
| 2006/0246700 A1 | 11/2006 | Johnson | |

* cited by examiner

*Primary Examiner*—Kenneth A Parker
*Assistant Examiner*—Jose R Diaz
(74) *Attorney, Agent, or Firm*—Snell & Wilmer L.L.P.

(57) ABSTRACT

A transistor heterogeneously integrating a power amplifier or switch with a low-noise amplifier having a substrate wafer selected from a group consisting of Gallium Arsenide (GaAs), Indium Phosphate (InP) and Gallium Antimonide (GaSb), the substrate wafer having a first end and a second end, a conducting layer above the first end of the substrate wafer, an isolation implant providing lateral isolation in the conducting layer, a first active layer deposited above the conducting layer and configured for the low-noise amplifier, and a buffer layer deposited above the conducting layer and configured for the low-noise amplifier.

19 Claims, 3 Drawing Sheets

HETEROGENEOUS INTEGRATION OF LOW NOISE AMPLIFIERS WITH POWER AMPLIFIERS OR SWITCHES

STATEMENT REGARDING GOVERNMENT RIGHTS

This invention was made with Government support under contract N66001-01-C-8032 awarded by the Department of Defense, DARPA, US Navy, Space & Naval Warfare Systems (SPAWAR). The Government has certain rights in the invention.

BACKGROUND OF THE INVENTION

1. Field of the Invention

The invention relates generally to High Electron Mobility Transistors (HEMTs). More particularly, the invention relates to a heterogeneous integration of low noise HEMT amplifiers with Pseudomorphic HEMT (PHEMT) power amplifiers or switches.

2. Description of Related Art

When donors are placed in a material with a higher conduction band energy than the channel, and close to the channel, they create an electron gas with high electron mobility in the channel. Transistors that implement this concept are known in the art as High Electron Mobility Transistors (HEMT).

Most HEMTs require at least two materials: barrier and channel materials. The barrier material that contains the donor must have a higher conduction band energy, but also improves the device breakdown by having a wider bandgap to accommodate high fields. The channel material that makes up the conducting layer is selected based on the transport properties of the electrons, with the bandgap also being a consideration to support high fields and hence high voltages. Typically, a HEMT system is made from Gallium Arsenide (GaAs) with Aluminum Gallium Arsenide (AlGaAs). The donor-containing wide bandgap material is AlGaAs and the conducting channel is GaAs.

HEMTs can be used for Monolithic Microwave Integrated Circuits (MMICs) such as low-noise amplifiers for receivers and power amplifiers for transmitters. There are four main reasons for their resilience. First, parasitic device resistance is small due to the high electron mobility (5,000-35,000 $cm^2$/Vs) and carrier concentrations (about $1\times10^{12}$ $cm^{-2}$ to about $5\times10^{12}$ $cm^{-2}$) achievable across the various material choices. Second, the electron velocities for the channel materials are high with peak values between about $1\times10^7$ $cm^2$/s to about $5\times10^7$ $cm^2$/s. Third, the technology has enjoyed relatively simple performance gains through gate-length scaling with 100 nm long gates now in production and down to 25 nm in development. Fourth, for power amplifiers, the HEMTs offer useable breakdown voltages and do not suffer from thermal runaway, which is a weakness of competing bipolar technologies.

High performance MMICs of up to 100 GHz use a Pseudomorphic HEMT (PHEMT) technology. PHEMT devices have a small amount of Indium (In) added to the GaAs channel. The growth of the channel is constrained to a critical thickness, that if exceeded, dislocations nucleate and the device properties degrade, and if maintained below the critical thickness, the channel material remains pseudomorphic with the same in-plane lattice constant as the GaAs host substrate but a larger lattice constant in the growth direction. The advantage of using a PHEMT device is higher conductivity channels with higher electron velocities and improved minimum noise figures. However, the disadvantage of using a PHEMT is a lower breakdown voltage when the concentration of Indium (In) is greater than the amount required for lattice matching to the substrate or barrier.

While prior art transistors can be optimized for either a low-noise amplifier for receivers or a power amplifier for transmitters, they cannot be optimized simultaneously with one another on the same substrate. This is because the low-noise amplifier cannot withstand large voltages used for the power amplifier without sacrificing its low noise characteristics. Separate substrates are typically used when a device, such as a telephone, utilizes a receiver and a transmitter. With an increasing demand for improved transistors, there remains a continuing need in the art for transistor that can simultaneously sustain high power drive and high sensitivity as in a low-noise amplifier.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein.

SUMMARY OF THE INVENTION

Figure 1:
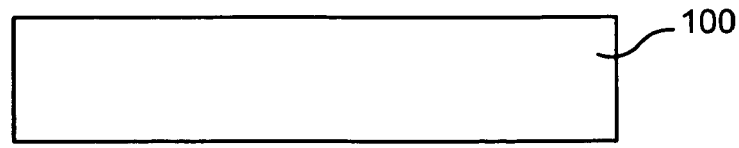
FIG. 1 schematically shows in cross section a step of a method for manufacturing a heterogeneous integration of low noise amplifiers with power amplifiers or switches on the same substrate in accordance with one embodiment of the invention.

One embodiment of the invention includes a transistor heterogeneously integrating a power amplifier or switch with a low-noise amplifier having a substrate wafer suitable for high electron mobility transistors. The substrate wafer has a first end and a second end, a conducting layer above the first end of the substrate wafer, an isolation implant that renders the conducting layer insulating, a buffer layer deposited above the conducting layer and configured for the low-noise amplifier, and an active layer deposited above the second end of the substrate wafer and configured for the low-noise amplifier.

In one embodiment, the substrate wafer can be Gallium Arsenide (GaAs), Indium Phosphide (InP) or Gallium Antimonide (GaSb). The active layer can include a layer of Indium Arsenide (InAs) and/or a layer of Aluminum Antimonide (AlSb). In addition, the conducting layer may be a pseudomorphic high electron mobility layer such as an active Gallium Arsenide (GaAs) layer.

The method for heterogeneously integrating the power amplifier or switch with the low-noise amplifier includes depositing conducting layer above a substrate wafer suitable for high electron mobility transistors, implanting ions in a first end of the conducting layer, depositing a first active layer above the first end of the conducting layer and configured for the low-noise amplifier, and depositing metal contacts for the low-noise amplifier at the first end of the conducting layer and for the power amplifier or switch at a second end of the conducting layer.

DETAILED DESCRIPTION OF THE PREFERRED EMBODIMENTS

Methods and systems that implement the embodiments of the various features of the invention will now be described with reference to the drawings. The drawings and the associated descriptions are provided to illustrate embodiments of the invention and not to limit the scope of the invention. Reference in the specification to "one embodiment" or "an embodiment" is intended to indicate that a particular feature, structure, or characteristic described in connection with the embodiment is included in at least an embodiment of the invention. The appearances of the phrase "in one embodiment" or "an embodiment" in various places in the specification are not necessarily all referring to the same embodiment. Throughout the drawings, reference numbers are re-used to indicate correspondence between referenced elements.

Prior art transistors are typically used for either a low-noise amplifier for receivers or a power amplifier for transmitters. Low-noise amplifiers and power amplifiers were not combined together on the same substrate because the low-noise amplifier cannot withstand large voltages used for the power amplifier. Separate substrates were typically used when a device, such as a cell phone, utilizes a receiver and a transmitter.

The invention allows for low-noise amplifiers to be heterogeneously integrated with power amplifiers or switches. The fabrication of this heterogeneous integration is illustrated in FIGS. 1-8, according to one method embodying the invention.

FIG. 1 shows a substrate wafer 100, such as Gallium Arsenide (GaAs), Indium Phosphide (InP) or Gallium Antimonide (GaSb) substrates, used as the base substrate for integrating low noise amplifiers with power amplifiers. Preferably, the substrate wafer 100 is semi-insulating and suitable for high electron mobility transistors (HEMT).

Figure 2:
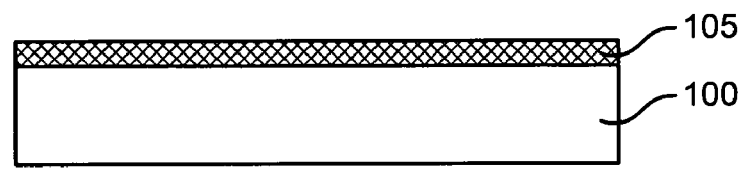
FIG. 2 schematically shows in cross section a step of a method for manufacturing a heterogeneous integration of low noise amplifiers with power amplifiers or switches on the same substrate in accordance with one embodiment of the invention.

Deposited on the top surface of the substrate wafer 100 is conductive layer, such as a PHEMT region 105 shown in FIG. 2. The PHEMT region 105 has a lattice constant approximately the same as the substrate wafer 100. In one embodiment, the PHEMT region 105 has a buffer layer, an active layer and a cap layer. Gallium Arsenide/Aluminum Gallium Arsenide (GaAs/AlGaAs) is used as a buffer layer when the substrate wafer 100 is GaAs. The buffer layer typically has a thickness of about 0.3 μm. The active layer has barrier and channel materials, for example, about 0.03 μm of AlGaAs barrier material and about 0.01 μm of Indium Gallium Arsenide (InGaAs) channel material. The cap layer can have GaAs with n+ doping, preferably, having a thickness of about 0.03 μm.

Figure 3:
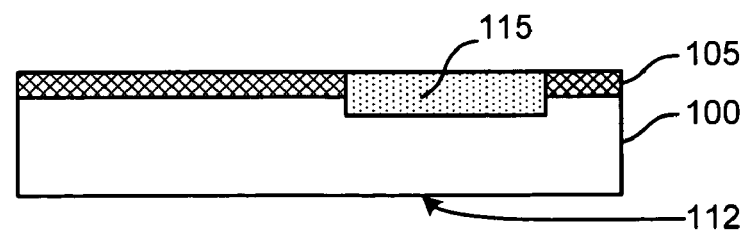
FIG. 3 schematically shows in cross section a step of a method for manufacturing a heterogeneous integration of low noise amplifiers with power amplifiers or switches on the same substrate in accordance with one embodiment of the invention.

FIG. 3 shows an isolation implant 115 formed by bombarding the PHEMT region 105 with ions. The isolation implant 115 can be rendered insulating by implanting Oxygen ($O_2$), Protons ($P^+$), Iron (Fe), and the like. The isolation implant 115 is used to provide lateral isolation between the low noise amplifier and the power amplifier. In one embodiment, the isolation implant 115 is positioned below one amplifier if that amplifier is at a higher elevation from a subsequent layer than the other, or between the amplifiers if they are located beside each other. This configuration also applies if a switch is heterogeneously integrated with a low noise amplifier. The thickness of implant 115 can be less than or greater than the thickness of the PHEMT region 105, preferably having a length of about 10 μm to about 10,000 μm, a width of about 10 μm to about 1000 μm and a depth of about him to about 2 μm.

It can be envisioned by a person skilled in the art that instead of bombarding ions to form an isolation, implant 115, the isolation implant 115 can be introduced by forming a cavity in the PHEMT region 105 and selectively growing the isolation layer 115 inside the cavity.

Figure 4:
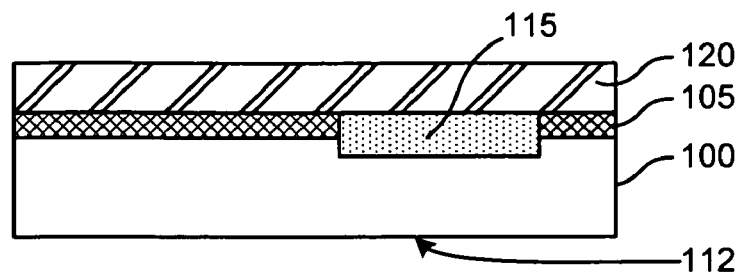
FIG. 4 schematically shows in cross section a step of a method for manufacturing a heterogeneous integration of low noise amplifiers with power amplifiers or switches on the same substrate in accordance with one embodiment of the invention.

FIG. 4 shows a buffer layer 120 deposited on the top surface of the PHEMT region 105. In one embodiment, the buffer layer 120 is an insulating material, such as Aluminum Gallium Antimonide (AlGaSb).

Figure 5:
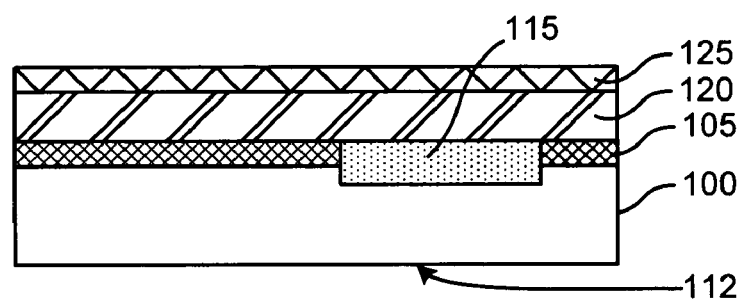
FIG. 5 schematically shows in cross section a step of a method for manufacturing a heterogeneous integration of low noise amplifiers with power amplifiers or switches on the same substrate in accordance with one embodiment of the invention.

To build low-noise amplifiers, an active layer 125 can be grown or deposited on the buffer layer 120, as shown in FIG. 5. In one embodiment, the active layer 125 has channel and barrier layers, for example, the channel is Indium Arsenide (InAs) with a thickness of about 0.15 μm, and the barrier is Aluminum Antimonide (AlSb) with a thickness of about 0.02 μm. The active layer 125 is deposited on top of the buffer layer 120 to allow for high electron mobility. It can be envisioned that multiple layers of AlSb and InAs can be grown or stacked on top of one another, for example, in the following sequence: AlSb, InAs, AlSb. In one embodiment, a protective cap (not shown) of Indium Aluminum Arsenide (InAlAs), Indium Arsenide (InAs), Gallium Antimonide (GaSb) or Aluminum Gallium Antimonide (AlGaSb) is grown on top of the active layer 125.

Figure 6:
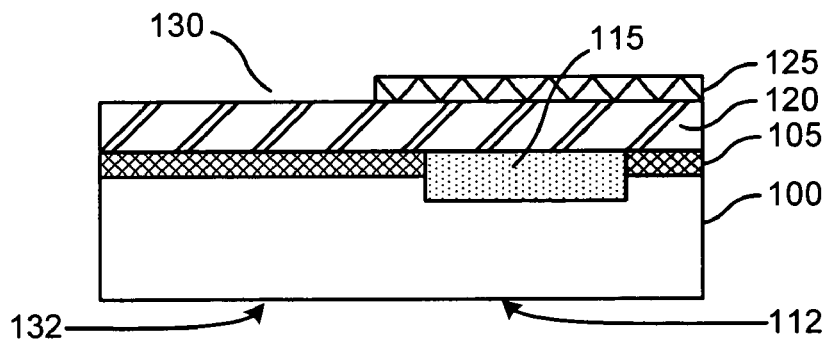
FIG. 6 schematically shows in cross section a step of a method for manufacturing a heterogeneous integration of low noise amplifiers with power amplifiers or switches on the same substrate in accordance with one embodiment of the invention.
Figure 7:
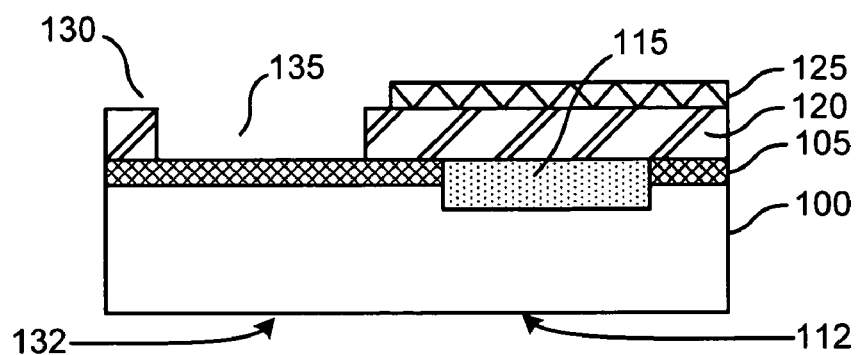
FIG. 7 schematically shows in cross section a step of a method for manufacturing a heterogeneous integration of low noise amplifiers with power amplifiers or switches on the same substrate in accordance with one embodiment of the invention.

In FIG. 6, the active layer 125 is etched in the region 130 on a second end 132 of the substrate 100 where the power amplifier is located. The resulting exposed buffer layer 120 on the second end 132 is further etched to provide a cavity 135 that extends to the PHEMT region 105, as shown in FIG. 7. In one embodiment, the region 130 and the cavity 135 can be formed by selectively depositing the buffer layer 120 and the active layer 125 on the first end 112 using masking and growth techniques known in the art.

Figure 8:
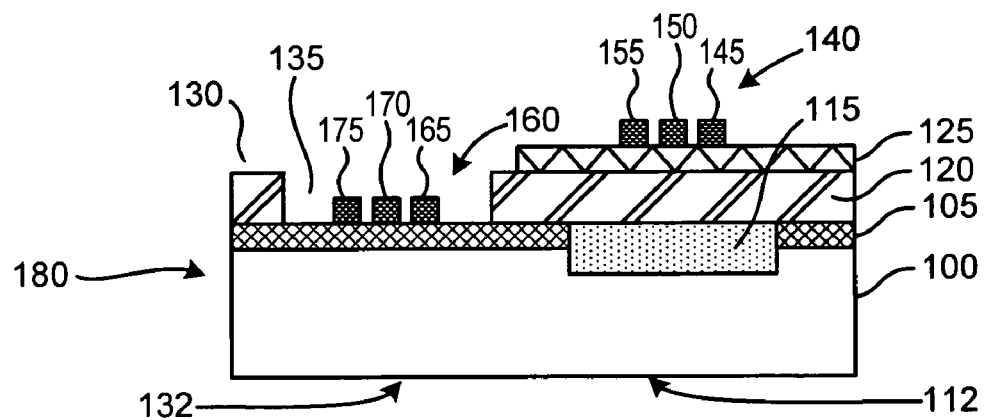
FIG. 8 schematically shows in cross section a step of a method for manufacturing a heterogeneous integration of low noise amplifiers with power amplifiers or switches on the same substrate in accordance with one embodiment of the invention.

Next, metal contacts, shown generally as 140 and 160 in FIG. 8, are deposited on the active layer 125 and the PHEMT region 105, respectively. Metal contact 140 has a drain contact 145, a gate contact 150 and a source contact 155. Similarly, metal contact 160 has a drain contact 165, a gate contact 170 and a source contact 175. The resulting configuration is a bi-level device 180 that heterogeneously integrate a low-noise amplifier with contacts 140 on the first end 112 and a power amplifier with contacts 160 on the second end 132. In one embodiment, the bi-level device 180 can heterogeneously integrate a low-noise amplifier on the first end 112 and a switch on the second end 132.

It can be envisioned that alternate configurations can be used to heterogeneously integrate a low-noise amplifier with a power amplifier or switch. For example, the power amplifier can be positioned on the first end 112 above the isolation implant 115, while the low-noise amplifier is located on the second end 132 inside the cavity 135. Furthermore, more than one implant 105 can be used to isolate the power amplifier and the low-noise amplifier from one another. If a one level configuration is used instead of the bi-level configuration, the implant 115 can be positioned in between the power amplifier or switch and the low-noise amplifier at a predetermined depth sufficient to isolate the large voltages used for the power amplifier.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs, are possible. For example, while the conducting layer is described in the context of a pseudormorphic high electron mobility transistor, the conducting layer may be used for other applications, such as, but not limited to, Metal-Semiconductor Field Effect Transistors (MESFETs), Metal-Insulator-Semiconductor Field-Effect Transistor (MISFET), or Heterostructure Field Effect Transistors (HFETs).

Those skilled in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. A transistor heterogeneously integrating a power amplifier or switch with a low-noise amplifier comprising:
    a substrate wafer suitable for high electron mobility transistors and having a first end and a second end;
    an isolation implant separating the first end from the second end;
    a pseudomorphic high electron mobility region deposited above the substrate wafer and configured for the power amplifier;
    a first buffer layer deposited above the pseudomorphic high electron mobility region and configured for the low-noise amplifier; and
    a first active layer deposited above the isolation implant and the first buffer layer, the first active layer configured for the low-noise amplifier.

2. The transistor of claim 1, wherein the substrate wafer is selected from a group consisting of Gallium Arsenide (GaAs), Indium Phosphate (InP) and Gallium Antimonide (GaSb).

3. The transistor of claim 1, wherein the pseudomorphic high electron mobility region comprises a second buffer layer and a second active layer.

4. The transistor of claim 1, wherein the first active layer has an Indium Arsenide (InAs) channel layer and an Aluminum Antimonide (AlSb) barrier layer.

5. The transistor of claim 3, wherein the second active layer has an Indium Gallium Arsenide (InGaAs) channel layer and an Aluminum Gallium Arsenide (AlGaAs) barrier layer.

6. The transistor of claim 1 further comprising metal contacts for the power amplifier or switch and the low-noise amplifier.

7. The transistor of claim 1, wherein the first buffer layer is Aluminum Gallium Antimonide (AlGaSb).

8. A transistor heterogeneously integrating a power amplifier or switch with a low-noise amplifier comprising:
    a substrate wafer selected from a group consisting of Gallium Arsenide (GaAs), Indium Phosphide (InP) and Gallium Antimonide (GaSb), the substrate wafer having a first end and a second end;
    a conducting layer above the first end of the substrate wafer;
    an isolation implant providing lateral isolation in the conducting layer;
    a first buffer layer deposited above the conducting layer and configured for the low-noise amplifier; and
    a first active layer deposited above the conducting layer and above the first buffer layer, the first active layer configured for the low-noise amplifier.

9. The transistor of claim 8, wherein the first active layer has an Indium Arsenide (InAs) channel layer and an Aluminum Antimonide (AlSb) barrier layer.

10. The transistor of claim 8, wherein the conducting layer comprises a buffer layer and a second active layer.

11. The transistor of claim 8, wherein the second active layer has an Indium Gallium Arsenide (InGaAs) channel layer and an Aluminum Gallium Arsenide (AlGaAs) barrier layer.

12. The transistor of claim 8 further comprising metal contacts for the low noise amplifier or switch on the second end of the substrate wafer and for the power amplifier on the first end of the substrate wafer.

13. The transistor of claim 8, wherein the buffer layer is Aluminum Gallium Antimonide (AlGaSb).

14. A transistor heterogeneously integrating a power amplifier or switch with a low-noise amplifier comprising:
    a substrate wafer suitable for high electron mobility transistors and having a first end and a second end;
    a pseudomorphic high electron mobility region deposited above the substrate wafer and configured for the power amplifier;
    an isolation implant above the second end of the substrate wafer, the isolation implant providing lateral isolation in the pseudomorphic high electron mobility region;
    a first buffer layer deposited above the pseudomorphic high electron mobility region and the isolation implant, the first buffer layer configured for the low-noise amplifier; and
    a first active layer deposited above the first buffer layer and the isolation implant, the first active layer configured for the low-noise amplifier.

15. The transistor of claim 14, wherein the substrate wafer is selected from a group consisting of Gallium Arsenide (GaAs), Indium Phosphide (InP) and Gallium Antimonide (GaSb).

16. The transistor of claim 14, wherein the pseudomorphic high electron mobility region comprises a second buffer layer and a second active layer.

17. The transistor of claim 16, wherein the second active layer has an Indium Gallium Arsenide (InGaAs) channel layer and an Aluminum Gallium Arsenide (AlGaAs) barrier layer.

18. The transistor of claim 14, wherein the first active layer has an Indium Arsenide (InAs) channel layer and an Aluminum Antimonide (AlSb) barrier layer.

19. The transistor of claim 14 further comprising metal contacts for the power amplifier or switch and the low-noise amplifier.

* * * * *